(12) United States Patent
Werner et al.

(10) Patent No.: US 7,091,125 B2
(45) Date of Patent: Aug. 15, 2006

(54) METHOD AND APPARATUS FOR STRUCTURING ELECTRODES FOR ORGANIC LIGHT-EMITTING DISPLAY AND ORGANIC LIGHT-EMITTING DISPLAY MANUFACTURED USING THE METHOD AND APPARATUS

(75) Inventors: Humbs Werner, Berlin (DE); Schrader Thomas, Berlin (DE)

(73) Assignee: Samsung SDI Co., Ltd., Suwon (KR)

( * ) Notice: Subject to any disclaimer, the term of this patent is extended or adjusted under 35 U.S.C. 154(b) by 67 days.

(21) Appl. No.: 10/635,484

(22) Filed: Aug. 7, 2003

(65) Prior Publication Data

US 2004/0051446 A1  Mar. 18, 2004

(30) Foreign Application Priority Data

Aug. 7, 2002  (DE) ................................. 102 36 854
Feb. 18, 2003  (KR) ....................... 10-2003-0010031

(51) Int. Cl.
*H01L 21/3213*  (2006.01)

(52) U.S. Cl. .............................. 438/669; 257/E21.332

(58) Field of Classification Search .................. 438/22, 438/34, 35, 115, 608, 609, 669, 690, 666; 216/94; 257/E21.332
See application file for complete search history.

(56) References Cited

U.S. PATENT DOCUMENTS

| 5,514,618 A | * | 5/1996 | Hunter et al. .................. 438/30 |
| 6,146,715 A | * | 11/2000 | Kim et al. ................... 427/555 |
| 6,376,799 B1 | * | 4/2002 | Amako et al. ......... 219/121.77 |
| 6,576,867 B1 | * | 6/2003 | Lu et al. ................ 219/121.69 |
| 6,719,916 B1 | * | 4/2004 | Dubowski et al. ............ 216/65 |

FOREIGN PATENT DOCUMENTS

JP  08222371 A  *  8/1996

OTHER PUBLICATIONS

"Microfabrication of an electroluminescent polymer light emitting diode pixel array," Salman Noach, Erez Z. Faraggi, Gil Cohen, Yair Avny, Ronny Neumann, Dan Davidov, and Aaron Lewis, Appl. Phys. Lett. 69 (24) Dec. 9, 1996, 0003-6951/96/69(24)/3650/3/$10.00, © 1996 American Institute of Physics.

* cited by examiner

*Primary Examiner*—Carl Whitehead, Jr.
*Assistant Examiner*—Jennifer M Dolan
(74) *Attorney, Agent, or Firm*—H.C. Park & Associates, PLC

(57) ABSTRACT

A method for structuring an electrode, such as, for example, a cathode and/or an anode, for an organic light-emitting display by ablating the electrodes using a laser beam. An apparatus using the method for structuring an electrode is also provided. The laser beam is expanded to cover at least one target portion of each electrode to be ablated. A method for repairing an organic light-emitting display using the method and apparatus is also provided.

21 Claims, 3 Drawing Sheets

EMISSION

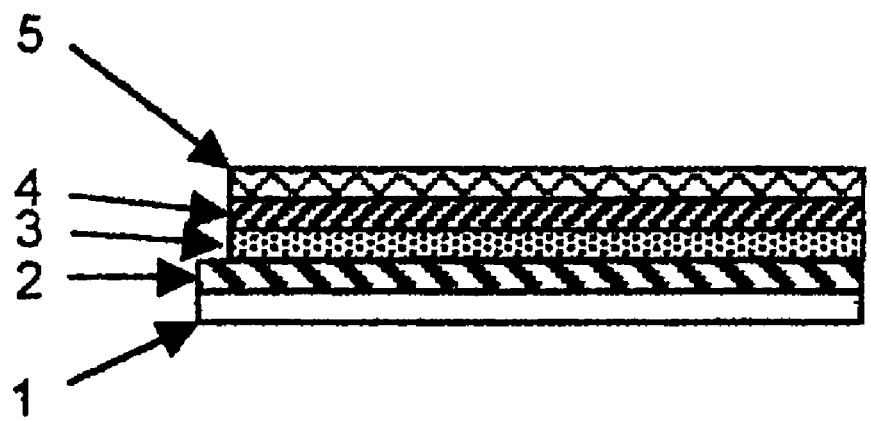
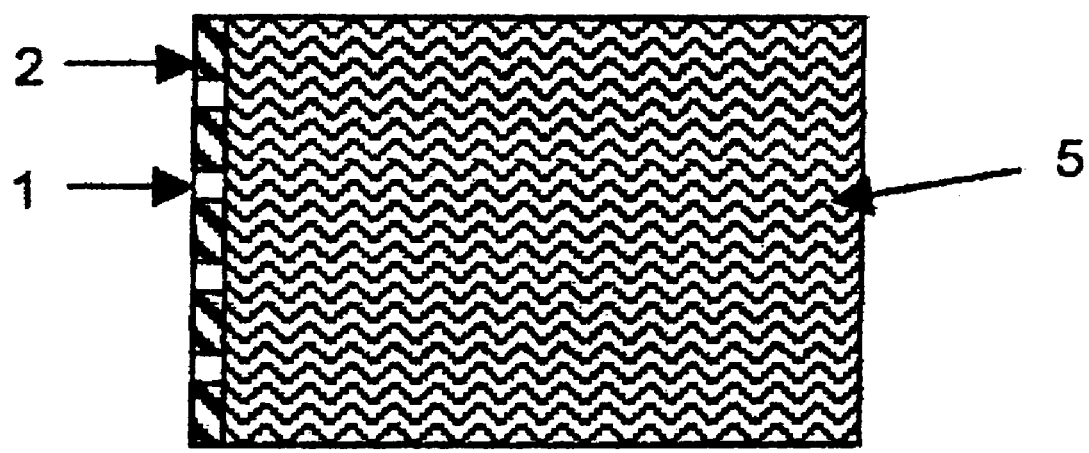

US 7,091,125 B2

METHOD AND APPARATUS FOR STRUCTURING ELECTRODES FOR ORGANIC LIGHT-EMITTING DISPLAY AND ORGANIC LIGHT-EMITTING DISPLAY MANUFACTURED USING THE METHOD AND APPARATUS

CROSS REFERENCE TO RELATED APPLICATION

This application claims the priorities of German Patent Application 102 36 854.6, filed on Aug. 7, 2002 in the German Patent Office, and of Korean Patent Application 2003-10031, filed on Feb. 18, 2003. The entire disclosures of both applications are incorporated herein by reference.

BACKGROUND OF THE INVENTION

1. Field of the Invention

The present invention relates to a method and an apparatus for structuring electrodesof an organic light-emitting device (OLED) used in a display unit. The present invention also relates to an organic light-emitting display manufactured using the method and apparatus.

2. Description of the Related Art

An organic light-emitting device is used in a display which represents symbols, images and the like. In an organic light-emitting device, an organic semiconductor layer (i.e. a light-emitting material layer) is positioned between two electrodes, for example, an anode and an electrode, and at least one of the electrodes is transparent for emitting light. The anode may be made, for example, of indium tin oxide which is transparent in the visible spectrum range. The indium tin oxide is deposited onto a glass substrate by a coating method. The cathode may be made, for example, of a metal, such as, for example, aluminum, which is vapor-deposited onto the organic semiconductor layer. When a voltage is applied to the electrodes, light is emitted and the color of emitted light is determined by the organic semiconductor layer. To emit light, positive charge carriers (also called "defect electrons" or "holes") from the anode as well as electrons from the cathode are injected into the organic semiconductor layer. Once the electrons and the holes meet, neutral excited molecules are formed. While emitting light, the excited molecules are deactivated to the ground state.

To provide a high-resolution display, the cathode and the anode are patterned to form a matrix. In the matrix, intersections of the two electrodes form pixels or picture point.

Generally, a first electrode, which is typically an anode, is arranged on a substrate, such as, for example, a glass substrate, and an organic semiconductor layer is applied to the first electrode. Thus, the first electrode can be structured relatively easily with, for example, photolithographic technology. However, it is difficult to structure a second electrode, which is typically a cathode, because, during the structuring process, the material of the organic semiconductor layer is susceptible to chemical and/or thermal factors. The chemical and/or thermal factors may adversely affect the organic semiconductor layer.

Various methods for structuring the second electrode are known.

For example, deposition, and more specifically, vapor-deposition may be used to provide the material for forming a cathode on an organic semiconductor layer. A so-called shadow mask, as disclosed in U.S. Pat. Nos. 6,153,254 and 2,742,192, may be used to structure the material. However, during vapor deposition, the shadow mask is subjected to thermal stress and can be contaminated with, for example, the materials being deposited over a period of time. Thus, the shadow mask should be regularly cleaned and replaced. However, regularly cleaning and/or replacing the shadow mask may be complicated and work-intensive. In addition, when a larger shadow mask is used for a larger substrate, it is difficult for the central portion of the substrate to have a high resolution because gravity affects the shadow mask which is positioned above the substrate.

However, if an overhanging photo-resist layer is applied to the first electrodethe uppermost electrode may be structured without a shadow mask, as disclosed, for example, in European Patent EP 0 910 128 A2. The overhanging structure allows the second electrode to be structured while the material for the second electrode is being vapor-deposited. However, even a little damage or defect in the overhanging structure may, for example, prevent an individual line of two electrodes from being separated from each other.

Another method for structuring an upper electrode is, for example, to use photolithographic technology and/or lift-off technology. However, application of water-containing chemicals may cause damage to the semiconductor layer, for example, because the organic semiconductor layer may be exposed to water. To avoid such water damage, a more expensive and complex device is needed.

Laser ablation may also be employed to structure an upper electrode. In laser ablation, at least some of the portions of a homogeneous cathode layer which are unessential to a cathode structure are eliminated from the cathode by means of a laser beam. Use of laser ablation technology in the production of organic light-emitting devices is disclosed, for example, in EP 0 758 192 A2, WO 98/53510, WO 99/03157 and U.S. Pat. No. 6,146,715 as well as in *Microfabrication of an Electroluminescent Polymer Light Emitting Diode Pixel Array* by Noach et al. (hereinafter "Noach"), Applied Physics Letters, Vol. 69, No. 24, 1996, pages 3650–3652.

In the aforementioned and other known laser ablation technologies, a point-shaped laser profile is applied. That is, a laser beam scans across the cathode surface and, more particularly, the laser beam is applied to the desired electrode surface portion using a deflection mirror or any optically active device. However, galvanometer units and/or deflection units, for example, can be costly, and thus the cost of using laser ablation technologies can be high. In addition, such laser scanning may give rise to an overlap, and thereby result in a non-uniform display screen because when a small mirror in the galvanometer unit is subjected to specific inertia with a high deflection frequency, excess oscillation is generated. In the method disclosed in Noach, for example, a mesh strip, as used in an electronic microscope, is directly applied to an electrode surface to be ablated. In this case, the mesh represents the resolution of the laser. While an excimer laser scans across the mesh, scanned electrode materials are eliminated through the openings of the mesh. However, the mesh and the electrode surface are in direct contact with each other, and thus the mesh may be damaged.

SUMMARY OF THE INVENTION

The present invention provides a cost-effective method and an apparatus for structuring an electrode, such as, for example, a cathode and/or an anode for an organic light-emitting display.

The present invention separately provides an organic light-emitting display manufactured using the method and apparatus.

This invention separately provides a method for structuring a homogeneous electrode for an organic light-emitting display, by ablating respective target portions of the electrode using a laser beam to form periodic electrode structures, such as, for example, cathode and/or anode lines. The laser beam is expanded to cover each target portion of each electrode to be ablated. For example, a width of the laser beam may be expanded to cover each target portion of the electrode to be ablated.

In various embodiments of the present invention, the laser beam is a pulse laser with a pulse duration of 20 ns or less.

In various embodiments of the present invention, the pulse laser is an ultraviolet laser, an infrared laser, or a visible laser. For example, in various embodiments of the present invention, the pulse laser may be a 248 nm KrF excimer laser.

In various embodiments of the present invention, the electrode is coated with a material that absorbs the laser beam prior to the ablation. For example, in the various embodiments of the present invention, the material for facilitating absorption may be graphite.

In various embodiments of the present invention, the laser beam is widened using an optical unit.

This invention separately provides an apparatus for structuring a homogeneous electrode for an organic light-emitting display using a laser beam, where the apparatus has a laser light source and an optical unit. The laser light source is used to emit the laser beam and the optical unit is used to widen the laser beam so that the laser beam covers each target portion of each electrode to be ablated.

In various exemplary embodiments of the present invention, the optical unit has a gap, and preferably several gaps.

In various embodiments of the present invention, the optical unit has a beam homogenizer, at least one gap and at least one cylindrical lens in order to provide a harmonic energy density.

In various embodiments of the present invention, the apparatus includes an exhaust unit.

In various embodiments of the present invention, the apparatus includes an outlet vent.

These and other features and advantages of this invention are described in, or are apparent from, the following detailed description of various embodiments of the systems and methods according to this invention.

BRIEF DESCRIPTION OF THE DRAWINGS

The above and other features and advantages of the present invention will become more apparent by describing in detail with reference to the following drawings.

FIG. 3 is a cross sectional view of a passive matrix substrate of an organic light-emitting device with a non-structured cathode.

FIG. 4 is a top plan view of a passive matrix substrate of an organic light-emitting device with a non-structured cathode.

DETAILED DESCRIPTION OF THE INVENTION

Figure 1:
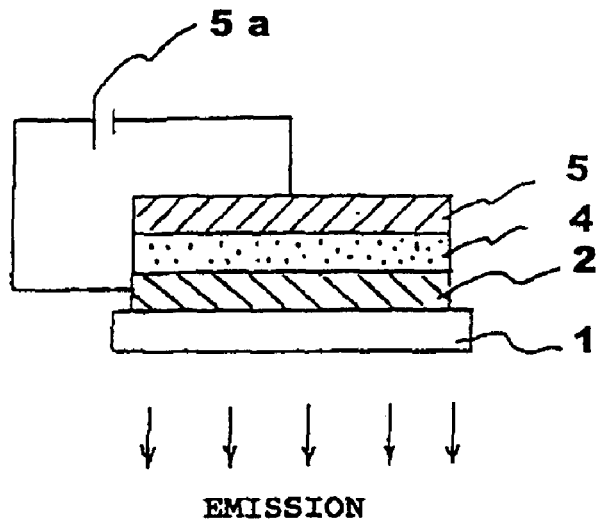
FIG. 1 is a schematic cross sectional view of one example of an organic light-emitting device.

FIG. 1 is a schematic cross sectional view of an example of an organic light-emitting device. The organic light-emitting device comprises a light-transparent substrate 1, an anode 2, a light-emitting layer 4 and a cathode 5. In the exemplary embodiment shown in FIG. 1, the anode 2 is arranged on the substrate 1 and the light-emitting layer 4 is arranged on the anode 2. The cathode 5 is placed on the light-emitting layer 4 and both the anode 2 and the cathode 5 are connected to a voltage source 5a. When a voltage is applied, the current starts to flow, thereby inducing the light-emitting material of the light-emitting layer 4 to emit light.

Figure 2:
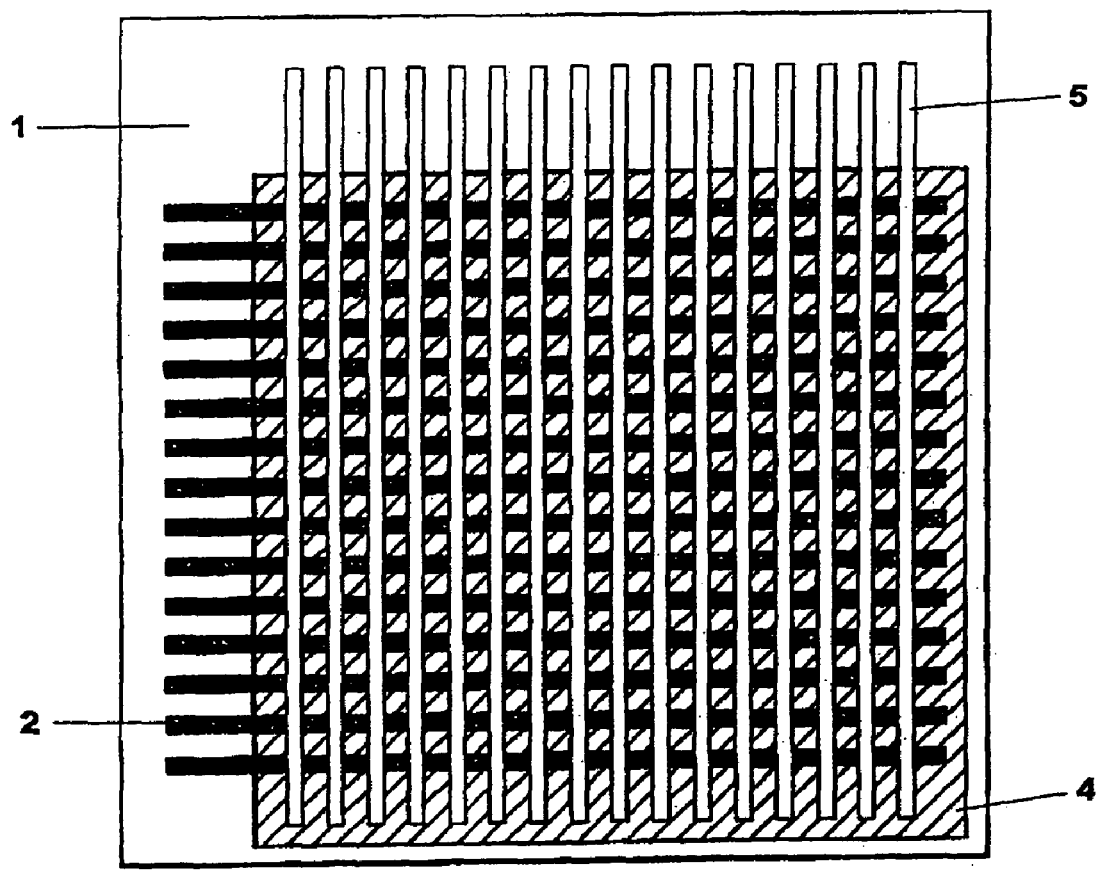
FIG. 2 is a schematic top plan view of a structural arrangement of a passive matrix.

For a high-resolution display, elements of such an organic light-emitting device are arranged in a matrix form. However, it should be understood that each element for forming the matrix may be selected independently. FIG. 2 illustrates a simple matrix type organic light-emitting device for activating a display. As shown in FIG. 2, a light-emitting material layer 4 is placed between two electrode lines 2 and 5, which are perpendicular to each other. The two lines represent a row and a column, respectively. In such a passive matrix arrangement, the organic light-emitting device carries out two functions: (1) emitting light as a part of the display, and (2) serving as a switch.

Each of FIGS. 3 and 4 shows an organic light-emitting device with a non-structured cathode. The device comprises a substrate 1, a structured light-transparent anode 2, a hole-transport layer 3, a light-emitting material layer 4, and a non-structured cathode 5.

In one exemplary embodiment of the present invention, the cathode 5 for a passive matrix is structured such that several cathode lines are aligned in parallel. Such a structure can be obtained by using the apparatus shown in FIGS. 5 and 6. In the apparatus shown in FIGS. 5 and 6, the optical unit 7 is used to expand the laser beam 6 so that the laser beam covers at least one target portion of the electrode. For example, it is possible to widen the laser beam such that the laser beam covers the cathode to be ablated, in such a way to structure the cathode 5 to have, for example, periodic cathode lines 9. For example, the laser beam 6 is illuminated onto the surface of the cathode in such a manner that a space between two cathode lines is filled with the laser beam. As such, the space between the two cathode lines is ablated.

A laser profile 8 can be accomplished through the optical unit 7 which has a beam homogenizer, a gap and a set of cylindrical lenses. The image of the gap represents the image of the space between two neighboring cathode lines.

It is possible to ablate with a laser beam portions of electrodes which are, for example, one micron or less. Therefore, a high-resolution display can be manufactured at low cost and in a precise manner. As laser technology advances, smaller and smaller portions may be ablated and thus, even higher resolution displays can be manufactured in accordance with the present invention.

When a space is formed at a target of a matrix substrate, the matrix substrate moves such that the next target to be ablated is positioned below the apparatus that includes a laser 6a and the optical unit 7. For example, the matrix substrate may be set to move a predetermined distance such that the next target to be ablated is positioned below the apparatus. More particularly, the matrix substrate may be set to move a predetermined distance in a plane parallel to the length of the substrate or a plane perpendicular to the length of the substrate. Therefore, in the various embodiments of the present invention, electrode surfaces that are originally far from the apparatus can be ablated.

Preferably, the amount of heat input into the matrix materials should be kept to a minimum. To reduce the amount of heat input into a material of the matrix, a pulse laser with, for example, a pulse duration of 20 ns or less may be used. For example, an ultraviolet laser such as a 248 nm KrF excimer laser can be used. A laser beam with a power density of 500 mJ/cm$^2$ and a pulse duration of 20 ns can, for example, efficiently ablate an aluminum layer with a thickness of about 250 nm with one shot. To apply a laser beam of a lower power density, it is recommended, for example, that the surface of an aluminum layer with a reflection coefficient of 0.9 at a wavelength of 248 nm be additionally coated with a strong absorbent, such as, for example, graphite.

Figure 5:
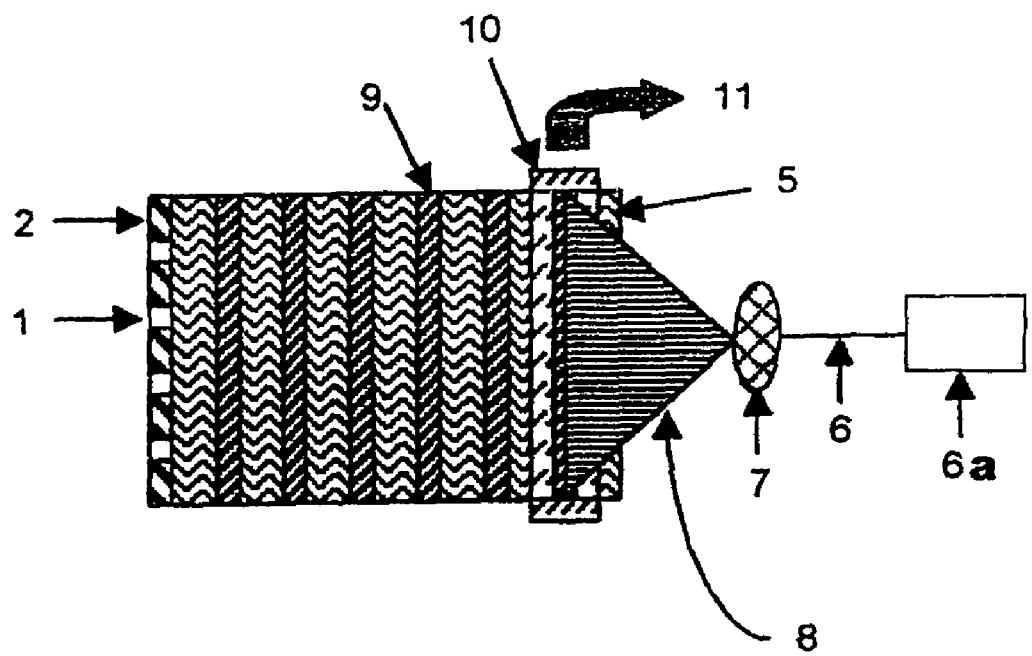
FIG. 5 is a top plan view of a passive matrix substrate of an organic light-emitting device with a structured cathode according to the present invention.
Figure 6:
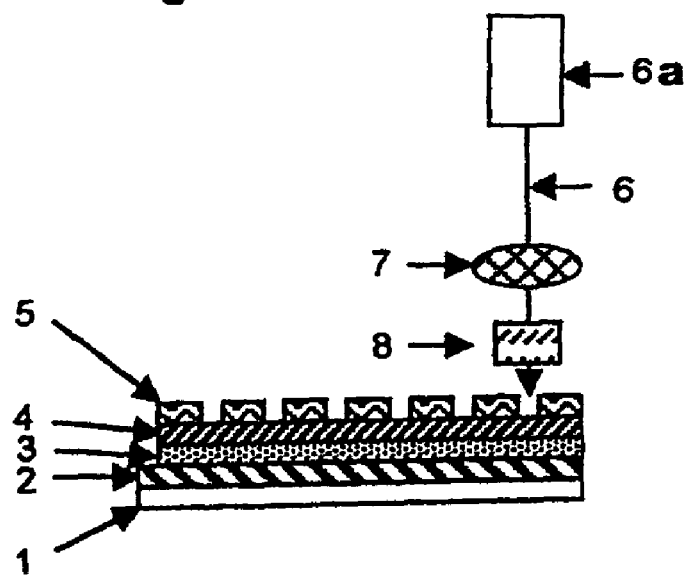
FIG. 6 is a cross sectional view of a passive matrix substrate of an organic light-emitting device with a structured cathode according to the present invention.

In the various embodiments of the present invention, in order for the ablated material not to contaminate the cathode and other layers, the ablated material is absorbed by exhaust unit 10, as shown in FIG. 5. The ablated material absorbed by the exhaust unit 10 is discharged through an outlet vent 11, as shown in FIG. 5.

The method of the present invention can also be used for further structuring and/or separating electrodes, such as, for example, cathode lines and/or anode lines which are not completely separated from each other after being subjected to a conventional structuring process, such as, for example, vapor deposition with a shadow mask and an overhanging photo-resist. A single laser shot can separate adjoining electrode lines. Therefore, the method of the present invention is very useful in separating adjoining electrode lines that are present in one or several positions. For example, cathode lines and/or anode lines that are not completely separated from each other after a first structuring process can be separated using the aforementioned method and apparatus.

As apparent from the above description, the methods and apparatus of the present invention can eliminate the aforementioned disadvantages and can structure electrodes of an organic light-emitting device at low cost.

In the various embodiments of the present invention, because laser ablation is used, there is no need for laser scanning.

In the various embodiments of the present invention, an expensive and complex galvanometer unit or deflection unit is not required.

In the various embodiments of the present invention, because the laser beam can be expanded to cover the width and/or length of the matrix substrate using an optical unit, the method and apparatus of the present invention can also be applied to a larger matrix substrate.

While the present invention has been particularly shown and described with reference to exemplary embodiments thereof, it will be understood by those of ordinary skill in the art that various changes in form and details may be made therein without departing from the spirit and scope of the present invention as defined by the following claims. Accordingly, the above-described-exemplary embodiments of systems and methods according to the present invention are intended to be illustrative, not limiting.

What is claimed is:

1. A method for structuring a homogeneous electrode for an organic light-emitting display, the method comprising:
    expanding a laser beam to cover each target portion of each electrode to be ablated, to form periodic electrode structures; and
    ablating respective target portions of the homogeneous electrode using the expanded laser beam,
    wherein the laser beam is a pulse laser with a pulse duration of 20 ns or less and the homogeneous electrode is coated with a material comprising graphite for facilitating absorption of the laser beam prior to the ablation.

2. The method of claim 1, wherein the periodic electrode structures are linear structures.

3. The method of claim 1, wherein the electrode is at least one of a cathode and an anode.

4. The method of claim 1, wherein the pulse laser is an ultraviolet laser, an infrared laser, or a visible laser.

5. The method of claim 1, wherein the pulse laser is a 248 nm KrF excimer laser.

6. The method of claim 1, wherein the homogeneous electrode is coated with a material for facilitating absorption of the laser beam prior to the ablation.

7. The method of claim 1, wherein the step of expanding a laser beam comprises expanding the laser beam to cover each target portion of each electrode to be ablated using an optical unit.

8. The method of claim 1, wherein the step of expanding a laser beam further comprises widening the laser beam to cover each target portion of each electrode to be ablated using an optical unit.

9. The method of claim 1, wherein the laser beam is expanded such that a width of the laser beam is widened to cover each target portion of each electrode to be ablated.

10. The method of claim 1, wherein the laser beam comprises a power density of about 500 $mJ/cm^2$.

11. A method for structuring a homogeneous electrode for an organic light-emitting display, the method comprising:
    expanding a laser beam to cover each target portion of each electrode to be ablated, to form periodic electrode structures; and
    ablating respective target portions of the homogeneous electrode using the expanded laser beam,
    wherein the homogeneous electrode is coated with a material comprising graphite for facilitating absorption of the laser beam prior to the ablation.

12. An apparatus for structuring a homogeneous electrode for an organic light-emitting display using ablation of a laser beam to form periodic electrode structures, the apparatus comprising:
    a laser light source for emitting the laser beam; and
    an optical unit for expanding the laser beam so that the laser beam covers each target portion of each electrode to be ablated,
    wherein the laser beam is a pulse laser with a pulse duration of 20 ns or less and the homogeneous electrode is coated with a material comprising graphite for facilitating absorption of the laser beam prior to the ablation.

13. The apparatus of claim 12, wherein the optical unit has a gap.

14. The apparatus of claim 12, wherein the optical unit has a plurality of gaps.

15. The apparatus of claim 12, wherein the optical unit comprises:
    a beam homogenizer,
    a gap; and
    at least one cylindrical lens.

16. The apparatus of claim 12, further comprising an exhaust unit.

17. The apparatus of claim 12, further comprising an outlet vent.

18. The apparatus of claim 17, further comprising an exhaust unit.

19. The apparatus of claim 12, wherein the electrode is a cathode or an anode.

20. The apparatus of claim 12, wherein the optical unit for expanding the laser beam expands a width of the laser beam to cover each target portion of each electrode to be ablated.

21. The apparatus of claim 12, wherein the laser beam comprises a power density of about 500 $mJ/cm^2$.

* * * * *